(12) United States Patent
Pries et al.

(10) Patent No.: US 11,087,643 B2
(45) Date of Patent: Aug. 10, 2021

(54) SMART SEAL ASSEMBLY

(71) Applicant: Honeywell International Inc., Morris Plains, NJ (US)

(72) Inventors: Henning Pries, Lotte (DE); Guido Temme, Bad Iburg (DE); Sandra Kreftsiek, Georgsmarienhütte (DE); Hans-Werner Temme, Lotte (DE)

(73) Assignee: HONEYWELL INTERNATIONAL INC., Charlotte, NC (US)

( * ) Notice: Subject to any disclaimer, the term of this patent is extended or adjusted under 35 U.S.C. 154(b) by 0 days.

(21) Appl. No.: 16/687,187

(22) Filed: Nov. 18, 2019

(65) Prior Publication Data

US 2020/0160758 A1 May 21, 2020

Related U.S. Application Data

(60) Provisional application No. 62/770,705, filed on Nov. 21, 2018.

(51) Int. Cl.
*G09F 3/03* (2006.01)
*G01D 4/04* (2006.01)
*G01R 22/06* (2006.01)

(52) U.S. Cl.
CPC .......... *G09F 3/0341* (2013.01); *G09F 3/0329* (2013.01); *G09F 3/0376* (2013.01); *G01D 4/04* (2013.01)

(58) Field of Classification Search
CPC .... G09F 3/0341; G09F 3/0376; G09F 3/0329; G09F 3/0317; G01D 4/04; G01D 4/004; G01R 22/066
USPC ............. 283/67, 70, 72, 74, 81, 94, 98, 901; 292/1, 2, 261, 300, 307 R
See application file for complete search history.

(56) References Cited

U.S. PATENT DOCUMENTS

| 4,609,217 | A | 9/1986 | Nielsen, Jr. et al. |
| 8,149,119 | B2 | 4/2012 | Hanft |
| 10,431,127 | B2 | 10/2019 | Avalos et al. |

FOREIGN PATENT DOCUMENTS

EP 1403841 A3 * 12/2004 ........... G09F 3/0364

* cited by examiner

*Primary Examiner* — Justin V Lewis
(74) *Attorney, Agent, or Firm* — Seager, Tufte & Wickhem, LLP

(57) ABSTRACT

A security seal identification that may be matched with an identification of a utility measuring meter. This matching may be done, for instance, by a code which is imprinted on the seal and then matched to a meter number in a database, or by a code such as an encryption of the number assigned to the meter. An encryption may be read by an app on a smartphone or checked offline to determine whether the seal belongs to the meter or if it was altered or changed. A mismatch of numbers or symbols may generally indicate a change or manipulation and warrant an investigation.

19 Claims, 7 Drawing Sheets

SMART SEAL ASSEMBLY

This application claims the benefit of U.S. Provisional Patent Application Ser. No. 62/770,705, filed Nov. 21, 2018. U.S. Provisional Patent Application Ser. No. 62/770,705, filed Nov. 21, 2018, is hereby incorporated by reference.

BACKGROUND

The present disclosure pertains to security of instrumentation such as utility metering.

SUMMARY

The disclosure reveals a security seal identification that may be matched with an identification of a utility measuring meter. This matching may be done, for instance, by a code which is imprinted on the seal and then matched to a meter number in a database, or by a code such as an encryption of the number assigned to the meter. An encryption may be read by an app on a smartphone or checked offline to determine whether the seal belongs to the meter or if it was altered or changed. A mismatch of numbers or symbols may generally indicate a change or manipulation and warrant an investigation.

DESCRIPTION

The present system and approach may incorporate one or more processors, computers, controllers, user interfaces, wireless and/or wire connections, and/or the like, in an implementation described and/or shown herein.

This description may provide one or more illustrative and specific examples or ways of implementing the present system and approach. There may be numerous other examples or ways of implementing the system and approach.

Currently used seals such as lead seals do not appear protective enough to avoid fraud. In markets with high fraud rates where up to about thirty percent of the used gas is stolen, the present seal may help improve detect and reduce an amount of fraud.

The seal may provide a benefit to the gas utilities as it enables them to get paid for virtually all of, for example, the gas, water or electricity that they are delivering. Up to the present seal, other seals appeared may be used with embossed information that was supposed to show who assembled the gas meter and reveal that the seal had not been touched. The present seal may be unique and can be matched with the gas meter (or all other kinds of meters). This matching may be done either by code (e.g., data matrix code) which is printed or lasered to the seal and then matched to the meter number in a database, or by a code that is an encryption of a serial number of the meter. An encrypted code may be read by an app on a smartphone and therefore checked offline to determine whether the seal belongs to the meter or if it was changed. The same approach may be done via a database but this might require remote access from the field. The present seal and approach may generate a way for gas or other utilities (e.g., electricity/water) to have fraud detection in the field.

The present seal may have a more or less smart approach. The approach may be effected by connecting data from a seal to the sealed device. For example, a serial number of a gas meter may be matched to a number on a seal assembly. This approach may need a database that has both numbers saved and matched as a pair. The approach may be done by printing the seals with a number, code, matrix code, and so on, before an assembly with a meter. After the assembly, both codes (e.g., of the seal and meter) may be matched.

Another approach may be to encrypt the serial number of the meter and to print the encrypted number on the seal after assembly. This approach may have a decoding system which could be handled through a smart phone app. This approach may be used offline or online.

Figure 1:
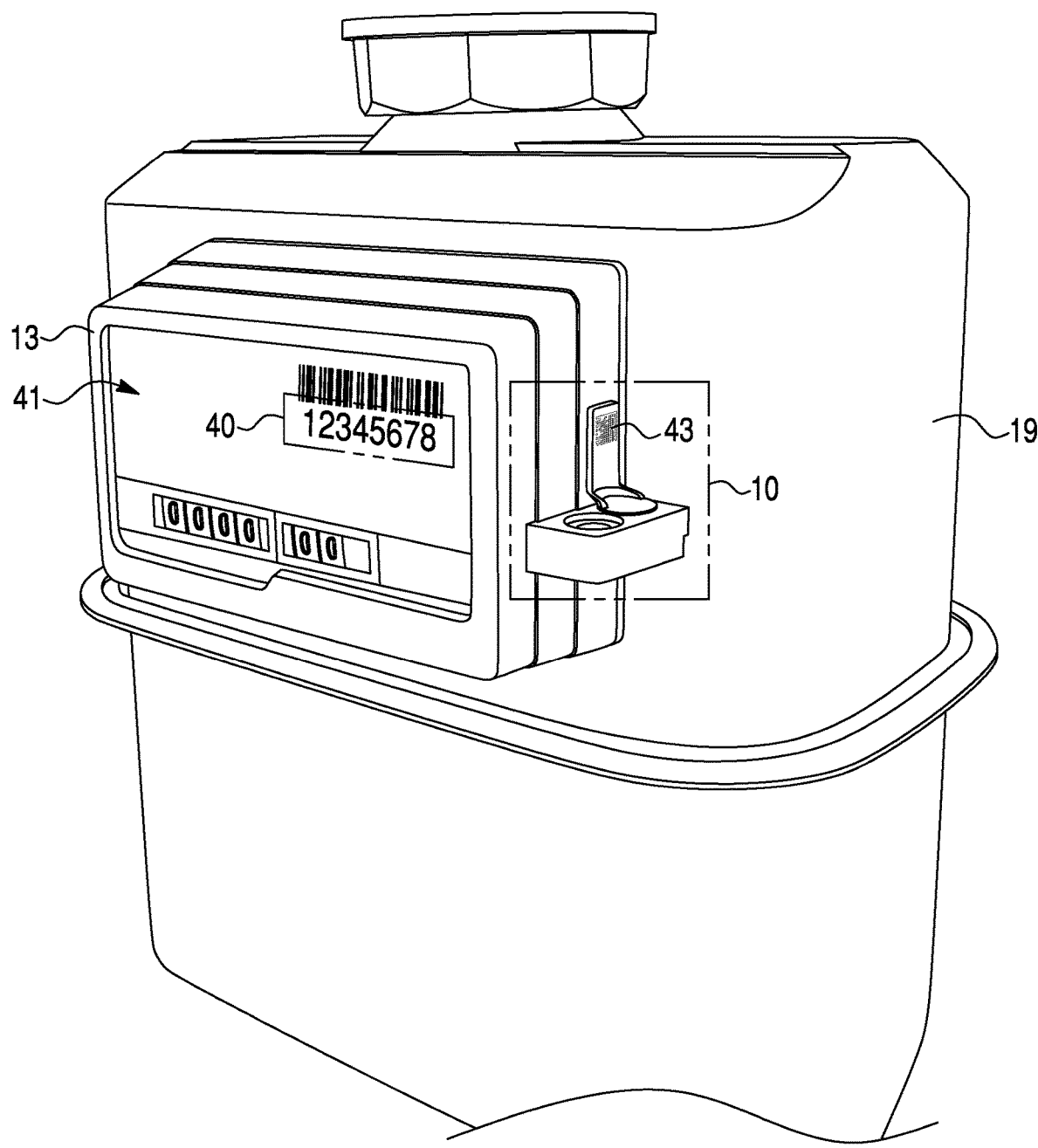
FIG. 1 is a diagram of an example meter that may have a present smart seal.

FIG. 1 is a diagram of an example meter that may have a present smart seal. One may take a meter number 40 from area 41 on an index cover 13 of a gas meter 19 in the Figure. The meter number 40 may be encrypted and generated into a code 43, e.g., a data matrix code. This generated code 43 may be placed or impressed on the smart seal assembly 10 in a form of printing, laser or other manner.

Figure 2:
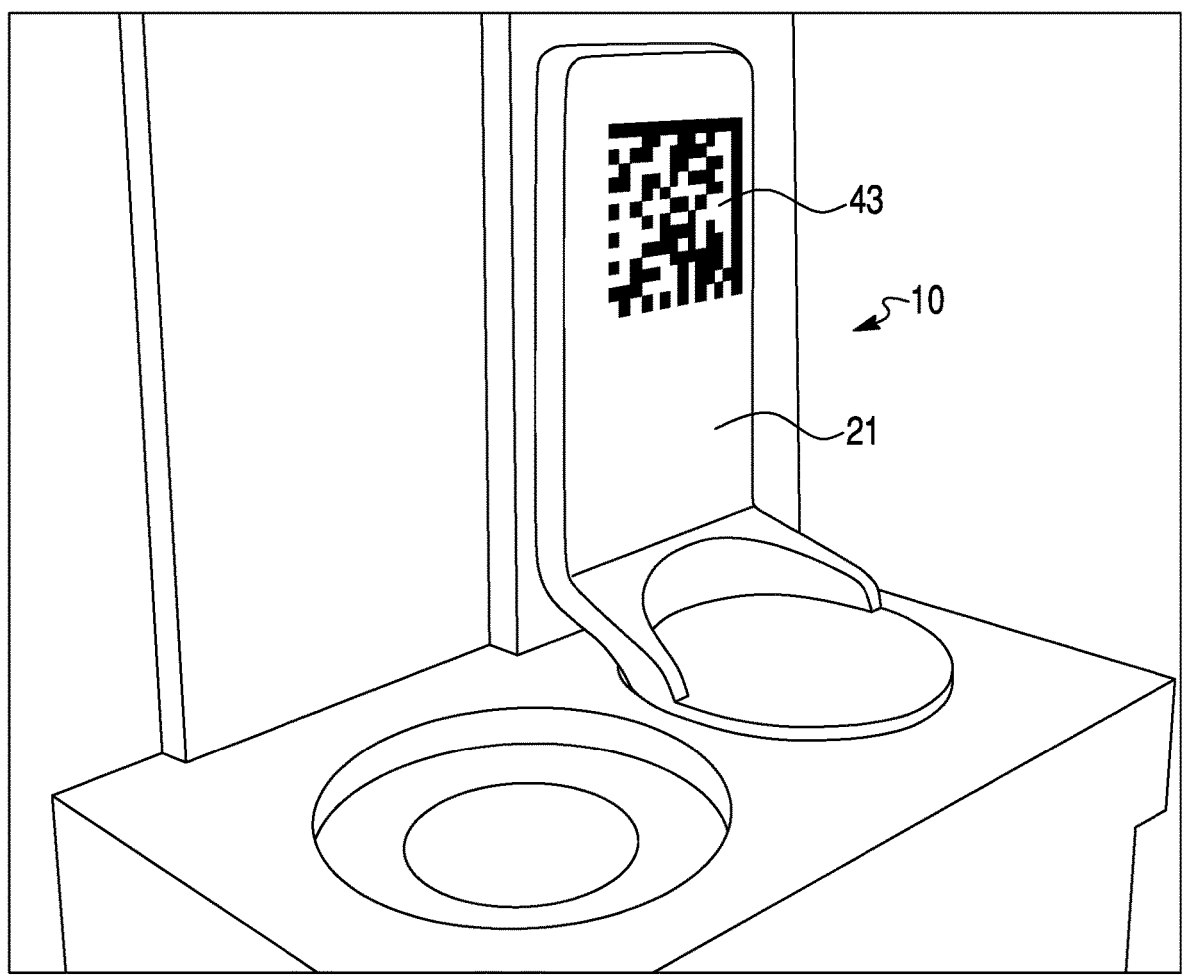
FIG. 2 is a diagram of an example approach for the present smart seal.

FIG. 2 is a diagram of an example approach for the present smart seal. Code 43 may be impressed on component 21 of seal assembly 10. With code 43 printed to seal assembly 10, the seal code 43 and the index meter number 40 are matched with each other. This matching may be checked, for example, by scanning code 43 with a smart phone with a special app that is able to decrypt the original index/meter number 40 from code 43. If the app gives a different number than the meter number 40 on the index cover, then fraud may have been committed, or at least another seal than the original seal has been used on this meter.

A seal assembly 10 with a random number, in lieu of code 43, may be taken and associated with an index/meter number 40. Both meter number 40 and assembly 10 random number may be taken and matched together in a data base.

In the field, the matrix code 43 may be scanned with a smart phone and then the code may be sent to a database server to determine which meter number 40 is married to this code 43. If there is no number found or a returned meter number from the database server does not fit or match the number 40 on meter 19, then fraud may have taken place, or at least another seal than the original seal has been used on this meter.

Figure 3:
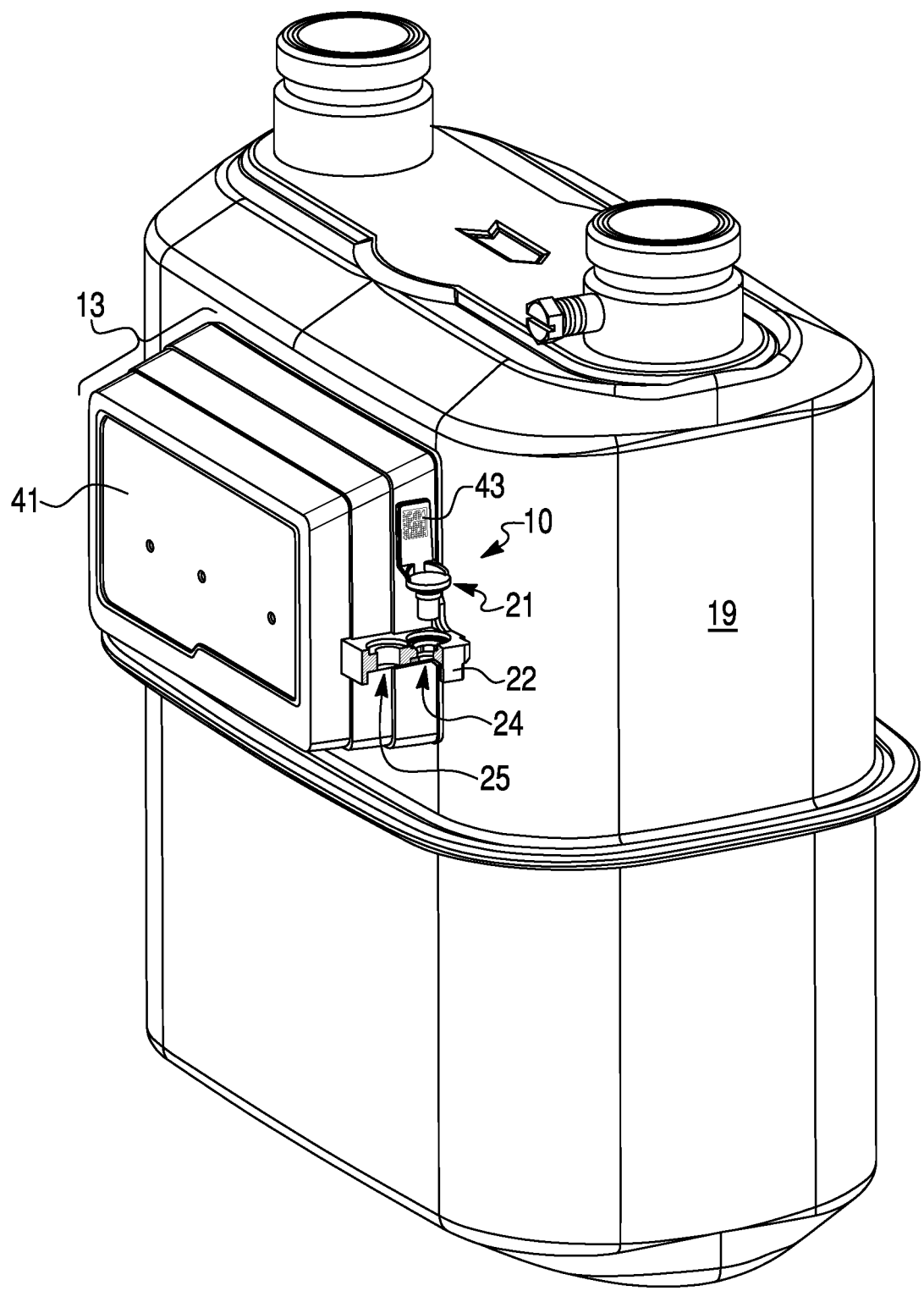
FIG. 3 is a diagram of a securing assembly associated with a meter and index.

For an example for application of the present system, FIGS. 3-7 are provided. FIG. 3 is a diagram of the seal assembly 10 having a rivet seal component 21 and receptacle component 22. Rivet seal component 21 may be plugged into receptacle component 22 for the sealing. Component 22 may be attached to index cover 13. Seal assembly 10 may lock index cover 13 to gas meter 19. If rivet seal component 21 is not in an opening, receptacle or hole 24 of component 22, then index cover 13 and other index parts may be removed from meter 19 without evidence of any wrongful forcible removal. To break components 21 and 22 apart may result in clearly observable damage to assembly 10. The one or more components need not necessarily be circular or some apparently prescribed shape, but might be some other shape. The materials used in or with the components may be those that can help or actually achieve an operational tamper proof seal assembly as described herein.

Index cover 13 may have a window 41 through which one may look at, for example, counter wheels showing an amount of a consumed gas volume that flows through gas meter 19.

Component 22 may be part of or attached to index cover 13. Meter 19 may be sealed, and seal component 21 may lock index cover 13 via component 22 and a plate or clip with gas meter 19. Component 22 may be regarded in practicality as the same part of index cover 13. Besides receptacle, opening or hole 24 in component 22, there may be another receptacle, opening or hole 25 in component 22. Hole or receptacle 25 may be used for further attachments that are made on gas meter 19 such as remote reading devices; which if mounted, they should be connected to the index cover 13. This connection may be done with a second seal like that of the above-noted component 21.

Figure 4:
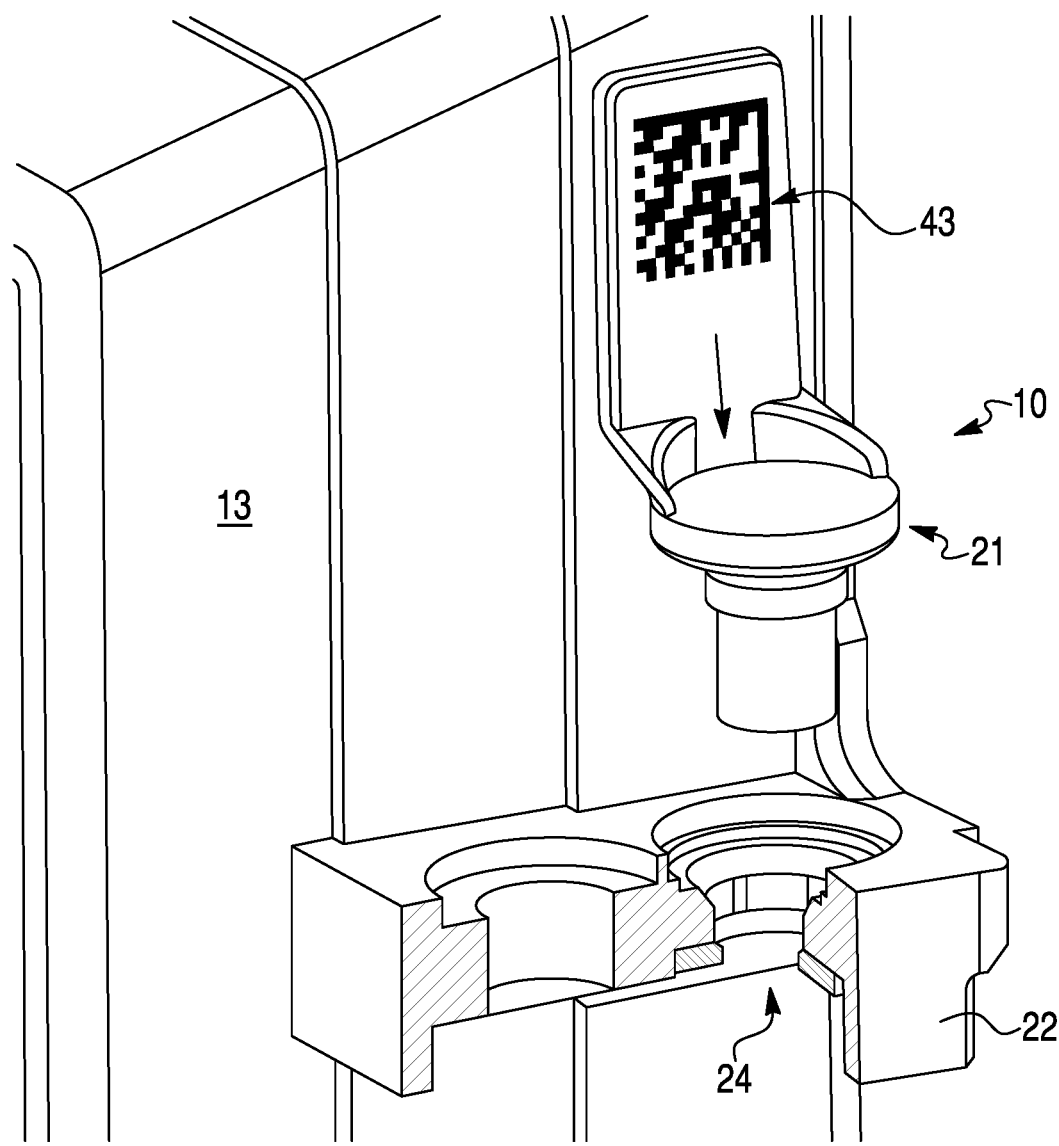
FIG. 4 is a diagram of an illustrative exploded view of the rivet seal assembly separated from the index of a meter.

FIG. 4 is a diagram of an illustrative exploded view of rivet seal assembly 10 with component 21 separated from component 22 and index 13 of meter 19, and direction of movement of component 21 to secure assembly 10.

Figure 5:
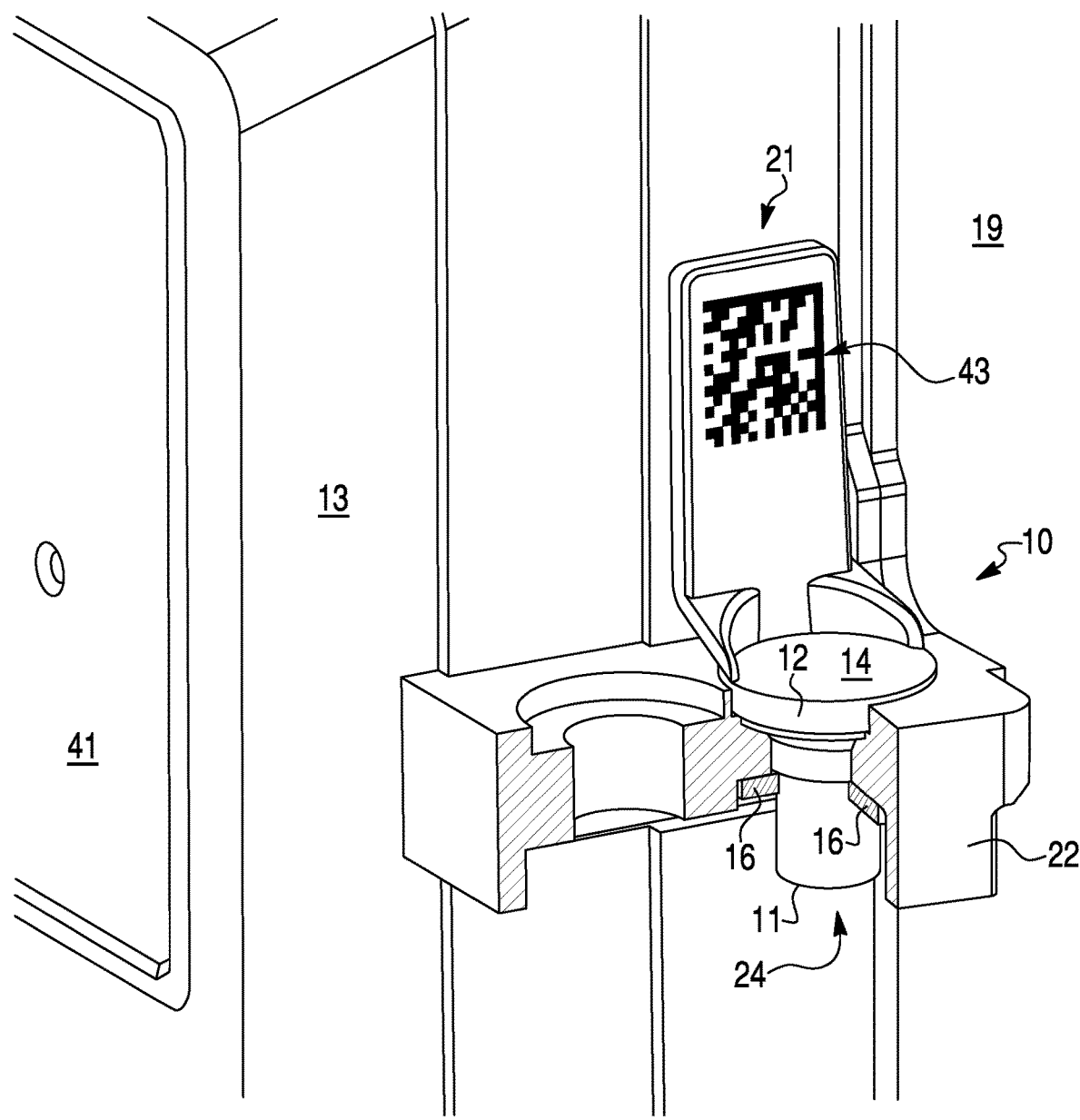
FIG. 5 is a top view diagram of a tamper proof rivet seal assembly for such things as meter indexes.

FIG. 5 is a top view diagram of a tamper proof rivet seal assembly 10 for such things as meter indexes. Components of seal assembly 10 may incorporate a tubular rivet 11, a malleable plastic or plastic-like item or structure 12 with a surface 14. The seal assembly 10 may be attached to a meter index 13. Plastic-like material item 12 may be formed on rivet 11 before it is inserted in receptacle 24. Plastic-like item 12 may be an over mold within an injection molding process, but it could also be welded to the rivet 11.

Figure 6:
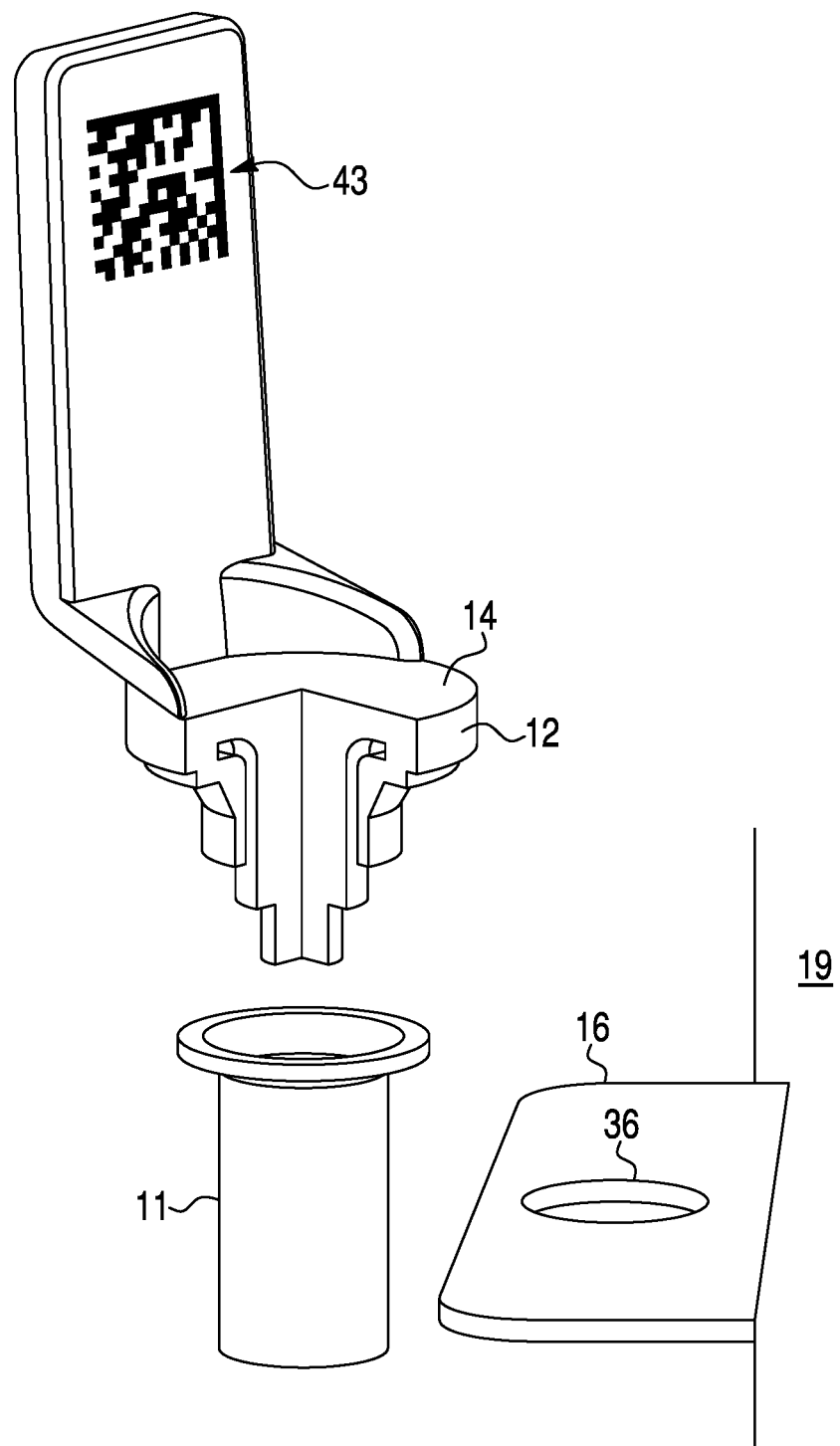
FIG. 6 is a diagram of an illustrative exploded view of the assembly with the rivet separated from the plastic-like component.

FIG. 6 is a diagram of an illustrative exploded view of assembly 10 with rivet 11 separated from plastic-like component 12 and plate 16 with an opening or hole 36. Opening 36 may have any shape. It may, for example, be a slot.

Figure 7:
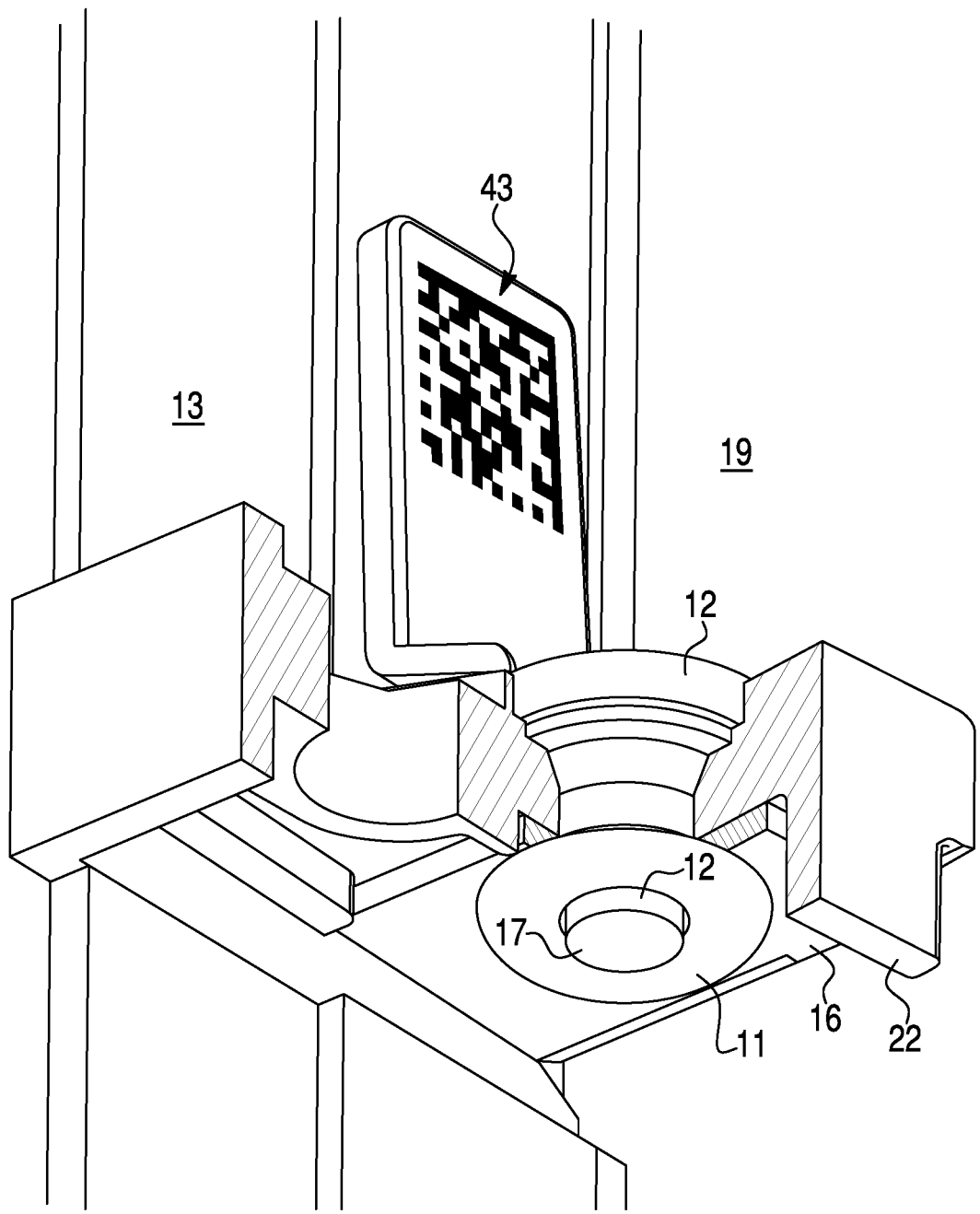
FIG. 7 is a diagram of a bottom view of the tubular rivet with a component protruding at a center of the rivet, and having a surface.

FIG. 7 is a diagram of a bottom view of tubular rivet 11 with component 12 protruding at the center of rivet 11, and having a surface 17.

The present approach may have a software component. A stack level may be a sensor, that is, a hardware device with some embedded software measuring/detecting and transmitting data (e.g., temperature, pressure, motion). A software type may incorporate a connected/connectivity, an offering available through a cloud, a direct or a remote connection (e.g., Lyric™ thermostat, SaaS), or may cover an infrastructure enabling connected services (e.g., sentience).

To recap, a smart secured locking mechanism may incorporate a first fixture, a second fixture, and a third fixture for connecting the first fixture to the second fixture. The first fixture may have a receptacle. The second fixture may have a plate with an opening. The third fixture may be a seal that incorporates a protrusive structure that fits into the receptacle of the first structure and into the opening of the plate of the second fixture to connect the first fixture to the second fixture. The second fixture may have a serial number. The serial number may be encrypted and put into a code. The code may be printed on the third fixture.

The serial number and the code may be checked for a match at a time afterwards. If the serial number and the code have a mismatch according to an encryption of the serial number or a decryption of the code, then the mismatch may be investigated.

The code may be decrypted with a smart phone having an app that can decrypt the code into a number that matches or not the serial number from the second fixture.

The code may be decrypted according to a table that lists codes corresponding to numbers.

The number and the code that the number corresponds to due to encryption may be stored at a secure and limited access storage component remote from the first, second and third fixtures.

The serial number of the second fixture may be a number randomly selected and attached to the third fixture.

The code may be a data matrix code.

The first fixture may be a protecting device for the second fixture. The second fixture may be a meter. The third fixture may be a locking device.

An approach for smart detection of a connection may incorporate attaching a first connecting fixture to a first apparatus, attaching a second connecting fixture to a second apparatus, locking the first connecting fixture and the second connecting fixture together with a securing mechanism, identifying the first apparatus with a first symbol, identifying the securing mechanism with a second symbol, associating the first and second symbols with each other within a database, with encryption, conversion or pairing, and checking for an association of the first and second symbols to verify that the locking of the first connecting fixture and the second connecting fixture together with the securing mechanism continues to be valid.

The checking for the association of the first and second symbols to verify that the locking of the first connecting fixture and the second connecting fixture together with the securing mechanism continues to be valid, may be effected with a smart phone.

The first symbol may be encrypted into a third symbol, the third symbol may be compared with the second symbol, and if the third and second symbols are the same, then the locking of the first connecting fixture and the second connecting fixture together with the securing mechanism may appear valid.

The first symbol may be encrypted into a third symbol. The third symbol may be compared with the second symbol. If the third and second symbols are not the same, then the locking of the first connecting fixture and the second connecting fixture together with the security mechanism may not necessarily be valid.

The first apparatus may be an index security protective cover. The first connecting fixture may be a receptacle fixture. The second apparatus may be a meter. The second connecting fixture may be a plate having an opening. The securing mechanism may be a protruding structure for insertion into the receptacle fixture and through the opening of the plate to connect the receptacle fixture to the plate to result in a mechanical connection of the first apparatus and the second apparatus to each other.

Encryption, conversion or pairing for associating the first and second symbols may be achieved with a smart phone.

A smart seal system may incorporate a meter, an index cover attached to the meter and situated over measuring components of the meter, and a seal attached to the meter and the index cover to prevent separation of the index cover and the meter. A meter number of the meter may be copied and converted into a code. The code may be printed to the seal. The code and the meter number may be sent and matched together in a database. The code may be scanned with a smart phone and a review search may be done to determine if the phone returns a meter number that is the same as the meter number converted to the code.

If the smart phone returns a meter number that is the same as the meter number converted to the code, then the seal may not necessarily have been changed or affected.

If the smart phone returns a meter number that is not necessarily the same as the meter number converted to the code, then the seal may have been changed or affected.

The meter number may be copied and converted into the code. The smart phone with an encryption app compatible for encrypting the code may scan and decrypt the code from the seal and provide a meter number. If a provided meter number is not the same as the meter number copied and converted with encryption, then the seal may have been changed or affected, or if the provided meter number is the same as the meter number copied and converted with encryption, then the seal may not necessarily have been changed or affected.

The code may be a number, a series of one or more letters, a combination of one or more numbers, one or more letters or other symbols, a bar code, or a multi-dimensional code. The code may be converted from the meter number printed on the seal with a laser.

U.S. patent application Ser. No. 16/582,900, filed Sep. 25, 2019, which claims the benefit of U.S. Provisional Patent Application Ser. No. 62/738,498, filed Sep. 28, 2018, is hereby incorporated by reference. U.S. Provisional Patent Application Ser. No. 62/738,498, filed Sep. 28, 2018, and U.S. patent application Ser. No. 16/582,900, filed Sep. 25, 2019, are hereby incorporated by reference.

Any publication or patent document noted herein may hereby be incorporated by reference to the same extent as if each individual publication or patent document was specifically and individually indicated to be incorporated by reference.

In the present specification, some of the matter may be of a hypothetical or prophetic nature although stated in another manner or tense.

Although the present system and/or approach has been described with respect to at least one illustrative example, many variations and modifications will become apparent to those skilled in the art upon reading the specification. It is therefore the intention that the appended claims be interpreted as broadly as possible in view of the related art to include all such variations and modifications.

What is claimed is:

1. A smart secured locking mechanism comprising:
a first fixture;
a second fixture; and
a third fixture for connecting the first fixture to the second fixture; and
wherein:
the first fixture comprises a receptacle;
the second fixture comprises a plate with an opening;
the third fixture is a seal that comprises a protrusive structure that fits into the receptacle of the first structure and into the opening of the plate of the second fixture to connect the first fixture to the second fixture;
the second fixture has a serial number;
the serial number is encrypted and generated into a code;
the code is printed on the third fixture;
the printed code is associated with a serial number in a database; and
a failure of the serial number in the database to match the serial of the second fixture is an indication that the seal has been changed or affected.

2. The mechanism of claim 1, wherein the code can be decrypted with a smart phone having an app that can decrypt the code into a number that is configured to be compared to the serial number from the second fixture.

3. The mechanism of claim 1, wherein the code is configured to be decrypted according to a table that lists codes of corresponding and encrypted serial numbers of second fixtures.

4. The mechanism of claim 1, wherein the serial number and the code that the serial number corresponds to due to encryption are stored at a secure and limited access storage component remote from the first, second and third fixtures.

5. The mechanism of claim 1, wherein the serial number of the second fixture is a number randomly selected and attached to the third fixture.

6. The mechanism of claim 1, wherein the code is a data matrix code.

7. The mechanism of claim 1, wherein:
the first fixture is a protecting device for the second fixture;
the second fixture is a meter; and
the third fixture is a locking device.

8. A method for smart detection of a connection comprising:
attaching a first connecting fixture to a first apparatus;
attaching a second connecting fixture to a second apparatus;
locking the first connecting fixture and the second connecting fixture together with a securing mechanism;
identifying the first apparatus with a first symbol;
identifying the securing mechanism with a second symbol;
associating the first and second symbols with each other within a database, with encryption, conversion or pairing; and
checking for an association of the first and second symbols to verify that the locking of the first connecting fixture and the second connecting fixture together with the securing mechanism is valid.

9. The method of claim 8, wherein the checking for the association of the first and second symbols to verify that the locking of the first connecting fixture and the second connecting fixture together with the securing mechanism continues to be valid, is effected with a smart phone.

10. The method of claim 9, wherein:
the first symbol is encrypted into a third symbol;
the third symbol is compared with the second symbol; and
if the third and second symbols are the same, then the locking of the first connecting fixture and the second connecting fixture together with the securing mechanism is valid.

11. The method of claim 9, wherein:
the first symbol is encrypted into a third symbol;
the third symbol is compared with the second symbol; and
if the third and second symbols are not the same, then the locking of the first connecting fixture and the second connecting fixture together with the security mechanism is not necessarily valid.

12. The method of claim 8, wherein:
the first apparatus is an index security protective cover;
the first connecting fixture is a receptacle fixture;
the second apparatus is a meter;
the second connecting fixture is a plate having an opening; and the securing mechanism is a protruding structure for insertion into the receptacle fixture and through the opening of the plate to connect the receptacle fixture to the plate to result in a mechanical connection of the first apparatus and the second apparatus to each other.

13. The method of claim 8, wherein encryption, conversion or pairing for associating the first and second symbols is achieved with a smart phone.

14. A smart seal system comprising:
a meter;
an index cover attached to the meter and situated over measuring components of the meter; and
a seal attached to the meter and the index cover to prevent separation of the index cover and the meter; and
wherein:
a meter number of the meter is copied and converted into a code;
the code is on the seal;
the code and the meter number are configured to be compared to the code and an associated meter number in a database; and
the code is configured to be scanned with a smart phone and cause the associated meter number from the database to appear on the smart phone such that the associated meter number can be compared to the meter number converted to the code.

15. The system of claim 14, wherein if the meter number appearing on the smart phone is the same as the meter number converted to the code, then the seal has not necessarily been changed or affected.

16. The system of claim 14, wherein if the meter number appearing on the smart phone is not the same as the meter number converted to the code, then the seal has been changed or affected.

17. The system of claim 14, wherein:
the meter number is copied and converted into the code;
the smart phone comprises an encryption app compatible for encrypting the code, the smart phone, via the encryption app, can scan and decrypt the code from the seal and provide a meter number; and
if a provided meter number is not the same as the meter number copied and converted into the code, then the seal has been changed or affected, or if the provided meter number is the same as the meter number copied and converted into the code, then the seal has not necessarily been changed or affected.

18. The system of claim 14, wherein the code is a number, a series of one or more letters, a combination of one or more numbers, one or more letters or other symbols, a bar code, or a multi-dimensional code.

19. The system of claim 14, wherein the code is converted from the meter number printed on the seal with a laser.

* * * * *